US011315919B2

(12) United States Patent
Stockinger

(10) Patent No.: US 11,315,919 B2
(45) Date of Patent: Apr. 26, 2022

(54) CIRCUIT FOR CONTROLLING A STACKED SNAPBACK CLAMP

(71) Applicant: NXP USA, Inc., Austin, TX (US)

(72) Inventor: Michael A. Stockinger, Austin, TX (US)

(73) Assignee: NXP USA, Inc., Austin, TX (US)

( * ) Notice: Subject to any disclaimer, the term of this patent is extended or adjusted under 35 U.S.C. 154(b) by 159 days.

(21) Appl. No.: 16/267,999

(22) Filed: Feb. 5, 2019

(65) Prior Publication Data

US 2020/0251466 A1 Aug. 6, 2020

(51) Int. Cl.
*H02H 9/00* (2006.01)
*H01L 27/02* (2006.01)
*H01L 27/07* (2006.01)
*H01L 49/02* (2006.01)
*H02H 9/04* (2006.01)

(52) U.S. Cl.
CPC ...... *H01L 27/0285* (2013.01); *H01L 27/0255* (2013.01); *H01L 27/0277* (2013.01); *H01L 27/0727* (2013.01); *H01L 28/20* (2013.01); *H01L 28/40* (2013.01); *H02H 9/046* (2013.01)

(58) Field of Classification Search
CPC ..... H02H 9/046; H01L 27/0255; H01L 28/40; H01L 28/20
USPC .......................................................... 361/56
See application file for complete search history.

(56) References Cited

U.S. PATENT DOCUMENTS

| 5,946,177 A | 8/1999 | Miller et al. |
| 6,617,906 B1 * | 9/2003 | Hastings ................... H03K 5/08 |
| | | 327/309 |
| 6,970,336 B2 | 11/2005 | Stockinger et al. |

(Continued)

OTHER PUBLICATIONS

Miller, J.W., M.G. Khazhinsky, and J.C. Weldon; "Engineering the Cascoded NMOS Output Buffer for Maximum $VV_{tl}$"; EOS/ESD Symposium 2000; 10 pages.

(Continued)

*Primary Examiner* — Jared Fureman
*Assistant Examiner* — Lucy M Thomas

(57) ABSTRACT

An integrated circuit is formed on a substrate, and the integrated circuit includes first and second conductors for providing supply and ground voltages, respectively, a clamp device, and a trigger circuit. The clamp device includes first and second metal oxide semiconductor (MOS) transistors coupled in series between the first and second conductors, wherein the first and second MOS transistors include first and second gates, respectively. The trigger circuit is coupled between the first and second conductors and is configured to drive the first and second gates with first and second voltages, respectively, in response to an electrostatic discharge (ESD) event. The trigger circuit includes a biasing circuit for generating the first voltage as a function of the supply voltage, a PMOS transistor coupled between the first conductor and the second gate, wherein the PMOS transistors includes a third gate. The trigger circuit also includes a resistive element coupled between the first conductor and the third gate, and a capacitive element coupled between the third gate and the first gate. In one configuration a voltage at the third gate should decrease in response to activation of the second MOS transistor.

21 Claims, 8 Drawing Sheets

(56) References Cited

U.S. PATENT DOCUMENTS

| | | | |
|---|---|---|---|
| 7,027,276 B2* | 4/2006 | Chen | H02H 9/046 |
| | | | 361/56 |
| 7,385,793 B1 | 6/2008 | Ansel et al. | |
| 8,010,927 B2 | 8/2011 | Gauthier, Jr. et al. | |
| 9,172,244 B1* | 10/2015 | Ma | H02H 9/046 |
| 9,438,030 B2 | 9/2016 | Stockinger | |
| 2007/0103825 A1* | 5/2007 | Ker | H01L 27/0266 |
| | | | 361/56 |
| 2010/0302693 A1* | 12/2010 | Hayashi | H01L 29/7393 |
| | | | 361/56 |
| 2013/0027820 A1* | 1/2013 | Padilla | H02H 9/046 |
| | | | 361/56 |
| 2013/0141825 A1 | 6/2013 | Kitagawa et al. | |
| 2013/0182359 A1* | 7/2013 | Jeon | H02H 9/044 |
| | | | 361/56 |
| 2014/0061716 A1* | 3/2014 | Zhan | H01L 29/87 |
| | | | 257/110 |

OTHER PUBLICATIONS

Stockinger M. and J.W. Miller; "Advanced ESD Rail Clamp Network Design for High Voltage CMOS Applications"; EOS/ESD Symposium 2004; 9 pages.

Stockinger M. and R. Mertens; "RC-Triggered ESD Clamp with Low Turn-on Voltage"; IEEE 2017; 4 pages.

* cited by examiner

CIRCUIT FOR CONTROLLING A STACKED SNAPBACK CLAMP

BACKGROUND

Electrostatic discharge (ESD) can produce a sudden and extremely high voltage that can damage an integrated circuit (IC). ESD can originate from many sources. For example, the typical human body can produce ESD of up to 4 kV. For ICs that are designed to operate at 3V, receiving an ESD of such proportions can be devastating.

Clamp devices protect ICs from ESD events. Clamp devices are typically formed on the same substrate that contains the IC, and are usually coupled between supply and ground rails thereof. In response to a sudden rise in voltage between the rails due to an ESD event, the clamp device is activated to discharge ESD current, thereby limiting stress voltage applied to ICs. Clamp devices can function for both unpowered ESD events (i.e., those ESD events occurring when the IC is not powered for normal operation) and powered ESD events (i.e., those ESD events occurring when power is applied to the IC for normal operation).

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION

The present disclosure will be described with reference to clamping devices coupled between supply and ground rails in ICs, it being understood the present disclosure can be applied in other configurations such as those in which clamp devices are coupled between an input/output (I/O) pad and a ground rail.

During an ESD event, voltage and current injected into the supply rail can suddenly and sharply rise. Clamp devices can limit this ESD stress by providing a discharge path through which ESD current can be safely conducted to the ground rail. For purposes of explanation only, VSS, the voltage on the ground rail, is presumed to be 0V.

Large metal-oxide-semiconductor (MOS) transistors can be used as clamp devices. During an ESD event these transistors can be activated to create channels beneath the gates through which ESD current is conducted to the ground rail. Or a discharge path to ground may be created using a mechanism called bipolar snapback (more fully described below). Further, the transistors may discharge ESD current through a combination of regular MOS transistor channel conduction and conduction of the parasitic BJT (also known as "bipolar snapback").

Figure 1:
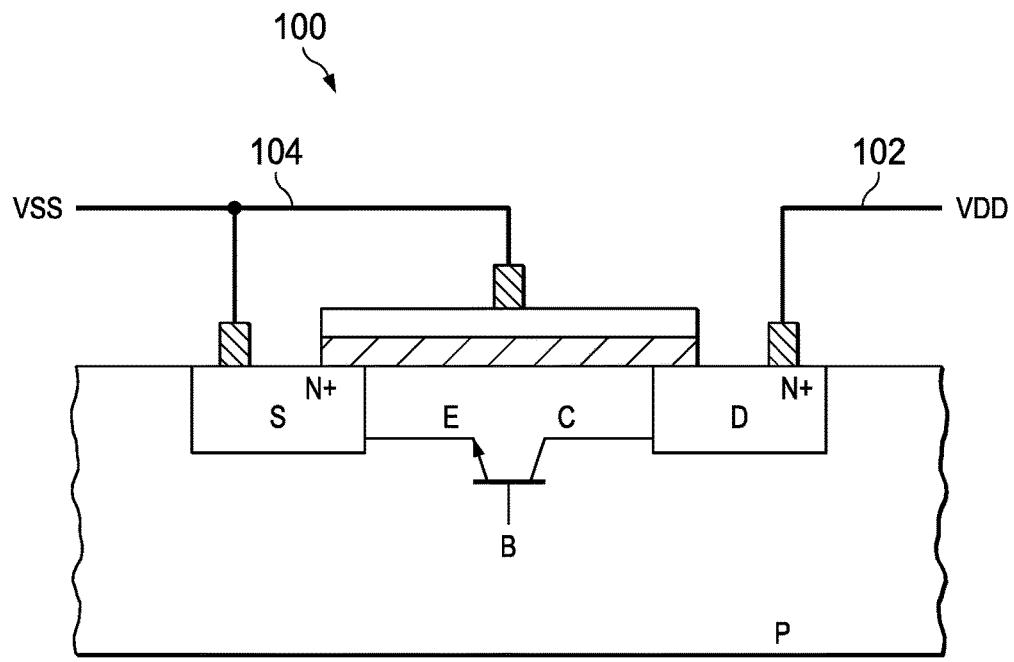
FIG. 1 illustrates a partial cross-sectional view of an N-channel MOS (NMOS) transistor employed as a clamp device.

FIG. 1 illustrates a partial cross-sectional view of an N-channel MOS (NMOS) transistor employed as a clamp device 100 within an IC. While the present disclosure will be described with respect to clamps that include one or more NMOS transistors, the present disclosure contemplates clamps that use other types of devices such as P-channel NMOS transistors.

The NMOS transistor in FIG. 1 is coupled between supply and ground rails 102 and 104, respectively. The NMOS transistor contains an inherent, parasitic bipolar junction transistor (BJT) due to the configuration of its doped material. In FIG. 1 the parasitic BJT is shown with an emitter E coupled to the source S, a collector C coupled to the drain D, and a base B coupled to the substrate. The source S of the NMOS transistor is coupled to the ground rail 104, and the drain D is coupled to the supply rail 102. The Gate terminal is coupled to the ground rail 104, which gives this structure the name "grounded-gate NMOS" (GGNMOS) transistor.

Figure 2:
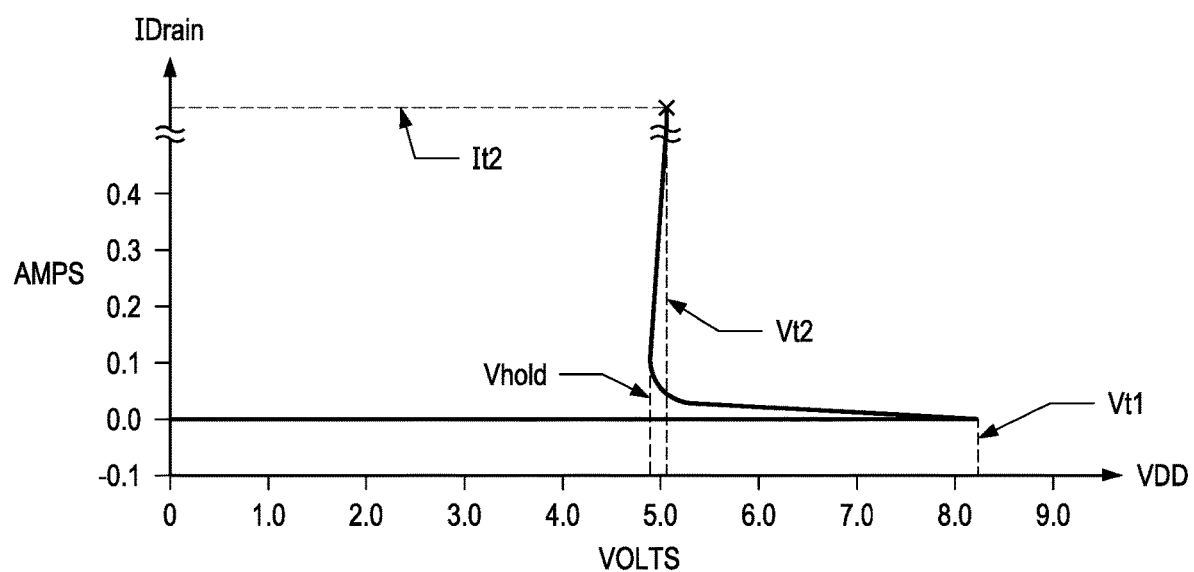
FIG. 2 is a transmission-line-pulse (TLP) diagram that visually demonstrates aspects of the clamp shown in FIG. 1.

During normal operation (i.e., no ESD event), the parasitic BJT does not come into play; no conductive path is present between the rails 102 and 104 via the NMOS transistor. However the parasitic BJT is activated when VDD, the voltage on the supply rail 102, suddenly increases above a threshold (hereinafter referred to as the trigger voltage Vt1) for the device due to an ESD event. The high VDD voltage induces an electric field between drain D and the underlying substrate that is strong enough to cause mobile charge carriers to energetically strike bound charge carriers in the body, which can then break free. And these new charge carriers can in turn repeat the process, leading to an avalanche current flowing towards the substrate contact (not shown). When this avalanche current is high enough to cause a voltage drop (e.g., 0.7V) across the substrate resistance (not shown), the resulting forward biasing of the base B to emitter E junction can activate the parasitic BJT device, allowing large current flow between rails 102 and 104 via the collector C and emitter E. Once the parasitic BJT activates, the high voltage that started the process is no longer necessary to sustain the current because the relatively large collector current causes impact ionization at the collector to base junction. Nevertheless, the conduction continues with increasing current, but at a much lower voltage (hereinafter referred to as the holding voltage Vhold). FIG. 2 is a transmission-line-pulse (TLP) diagram that visually demonstrates the mechanism of bipolar snapback. When VDD increases to a voltage equal to trigger voltage Vt1, the parasitic BJT is activated, and a relatively large ESD current is conducted to ground Importantly, the voltage on the supply rail 102 quickly snaps back to Vhold. The voltage at the drain may continue to increase with increasing current. Unfortunately, there is a limit to the current that clamp 100 can conduct during snapback. If current exceeds the limit (hereinafter failure current It2), clamp 100 may be rendered permanently inoperable. Vt2 in FIG. 2 designates the failure voltage corresponding to It2.

Although single NMOS transistor clamps like that shown in FIG. 1 can be used to protect ICs using snapback, several problems exist. For example, the trigger voltage Vt1 may exceed the failure voltage of the IC the clamp is designed to protect. If it does, a sudden increase in VDD could damage the IC before VDD snaps back to Vhold. Further, the magnitude of lower holding voltage Vhold can also be a problem during a powered ESD event. When the clamp activates and VDD snaps back to Vhold, it should be above the maximum operating voltage of the IC so that the clamp will deactivate once the ESD event ends. If Vhold is below the maximum operating voltage, the clamp could stay in the conducting "activated" state even after the ESD event has passed. This is known as latch-up and may degrade normal IC operation. Gate induced drain leakage current (GIDL) is yet another potential problem with clamp 100 shown in FIG. 1. ICs are being designed to operate at higher VDD voltages. GIDL of NMOS transistors increases exponentially with drain-to-source voltages above a certain level (e.g., 2.5V). If the IC is designed to operate at VDD up to 3.6V, GIDL leakage may be exceedingly excessive. Also, as noted above, if current flowing through the clamp 100 exceeds its failure current It2 after snapback, clamp 100 could be damaged and rendered unable to provide subsequent protection. Other issues are contemplated.

A stacked clamp, where two NMOS transistors are connected in series, is an alternative to the single NMOS transistor clamp shown in FIG. 1. Stacked clamps may contain a single stack of NMOS transistors or multiple stacks of NMOS transistors, each stack coupled in parallel with the others. The present disclosure will describe a trigger circuit for controlling a stacked clamp containing a single stack of NMOS transistors or a stacked clamp containing multiple stacks of NMOS transistors. As will be more fully described below, stacked clamps provide optimal ESD protection when ESD current is discharged through bipolar snapback in parallel with MOS channel creation.

Figure 3A:
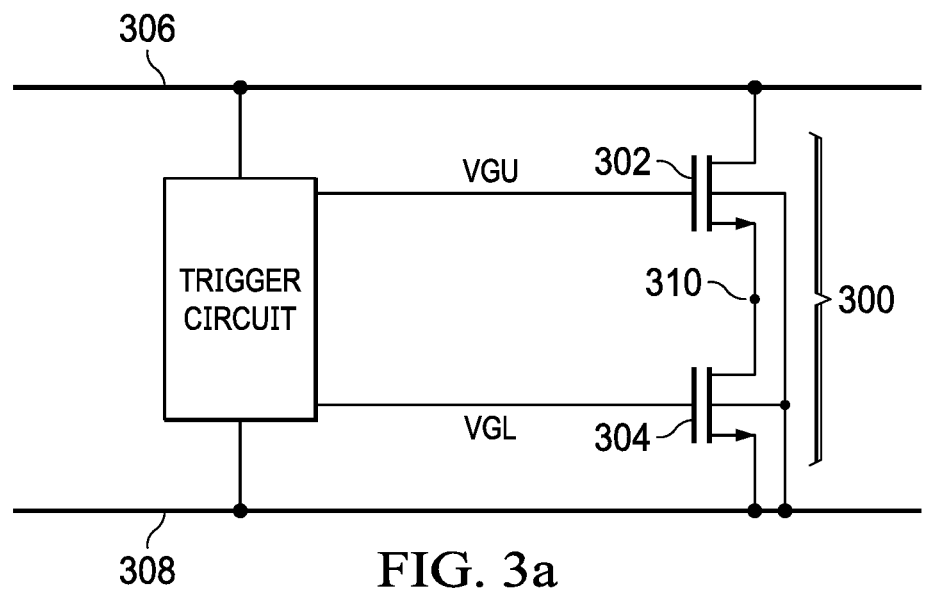
FIGS. 3a and 3b illustrate schematic and partial cross-sectional views of a stacked clamp.

FIG. 3a is a schematic view of a trigger circuit for controlling stacked clamp 300 containing a single stack of NMOS transistors during an ESD event. Stacked clamp 300 includes a single stack of upper and lower NMOS transistors 302 and 304, respectively, coupled in series between supply and ground rails 306 and 308, respectively. The trigger circuit controls NMOS transistors 302 and 304 via upper and lower gate voltages VGU and VGL, respectively.

Figure 3B:
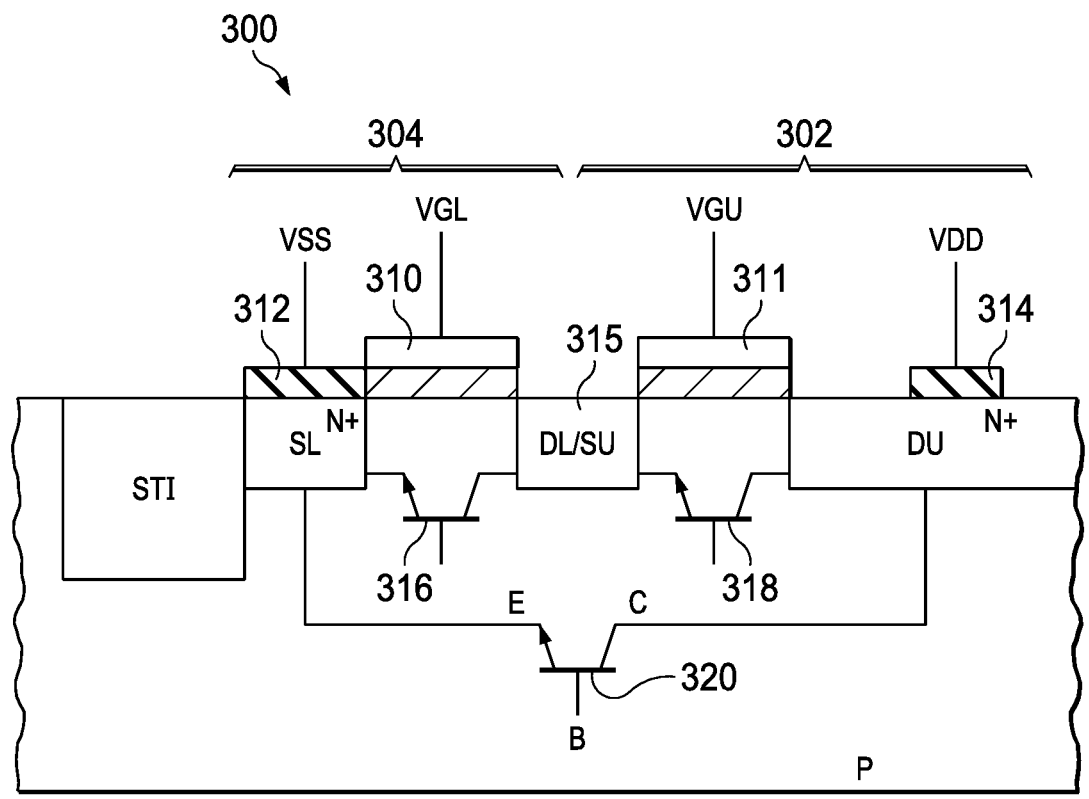

FIG. 3b illustrates a cross-sectional view of an example stacked clamp 300 formed on a silicon substrate. Lower and upper NMOS transistors 304 and 302, respectively, include polysilicon gates 310 and 311, respectively, which are connected to receive gate control voltages VGL and VGU, respectively. Lower source SL is biased to VSS via silicide layer 312. Upper drain DU is partially covered by silicide 314 and biased to VDD as shown. A shared active region 315 contains the drain DL of lower NMOS transistor 304 and the source SU of upper NMOS transistor 302. In the example stacked clamp 300, silicide does not cover this shared active region; however, in another embodiment region 315 may be covered by silicide.

FIG. 3b shows inherent parasitic BJTs 316 and 318. The shared active region 315 enables an inherent lateral parasitic BJT 320. When VDD on the supply rail increases to Vt1 of BJT 320 due to an ESD event, BJT 320 enters snapback and conducts ESD current to VSS in much the same manner as described above with respect to FIG. 2. Silicide protection (SBLK) to limit silicide 314 on upper drain DU is a common way to improve uniform snapback conduction in general.

Stacked clamp 300 can provide advantages over single NMOS transistor clamps like that shown in FIG. 1. One advantage is that VDD can be distributed between the upper and lower NMOS transistors 302 and 304, respectively, which reduces GIDL. Furthermore, in applications where the VDD operating range exceeds the safe operating area (SOA) of a single NMOS transistor, stacked clamp 300 can still provide an effective clamping solution by limiting the individual operating voltages of each NMOS transistor. In this case an appropriate DC bias voltage VGU may be applied to gate 311 during normal chip operation.

The trigger circuit biases the gates of NMOS transistors 302 and 304 during an ESD event to put clamp 300 in optimal condition for snapback operation. In one embodiment, the gates of upper NMOS transistor 302 and lower NMOS transistor 304 are initially biased to an intermediate voltage level (e.g. VDD/2) and VSS, respectively. In other words, VGU=VDD/2 and VGL=VSS during normal chip operation. However, during an ESD event the trigger circuit increases VGU and VGL to higher voltage levels to facilitate MOS channel creation, which in turn leads to a more reliable snapback of BJT 320. However, VGU and VGL should be limited in order to avoid issues such as increased Vt1, increased Vhold, and decreased It2 as will be more fully described below.

A stacked clamp 300 with series connected NMOS transistors 302 and 304 was subjected to TLP testing with different combinations of VGU and VGL. The results of the testing were recorded and are presented in the TLP diagrams of FIGS. 4a-4c. These TLP plots illustrate the dependence of Vt1, Vhold, and It2 on VGU and VGL.

Figure 4A:
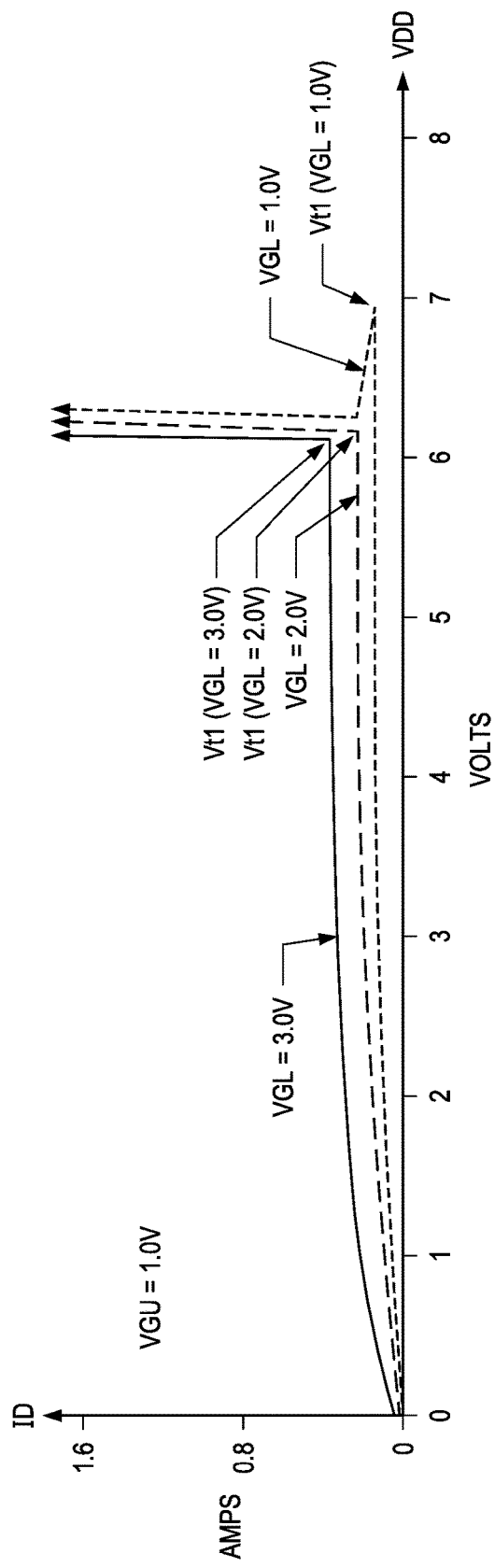
FIGS. 4a-4c illustrate TLP diagrams that demonstrate operational aspects of the clamp shown in FIGS. 3a and 3b.
Figure 4B:
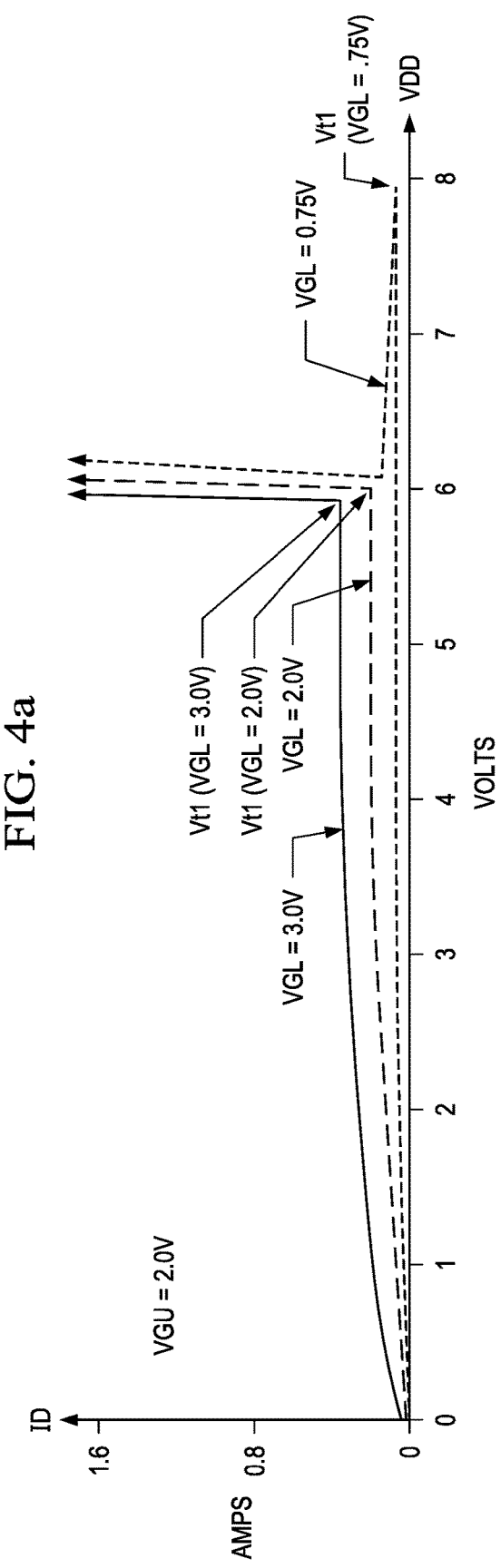
Figure 4C:
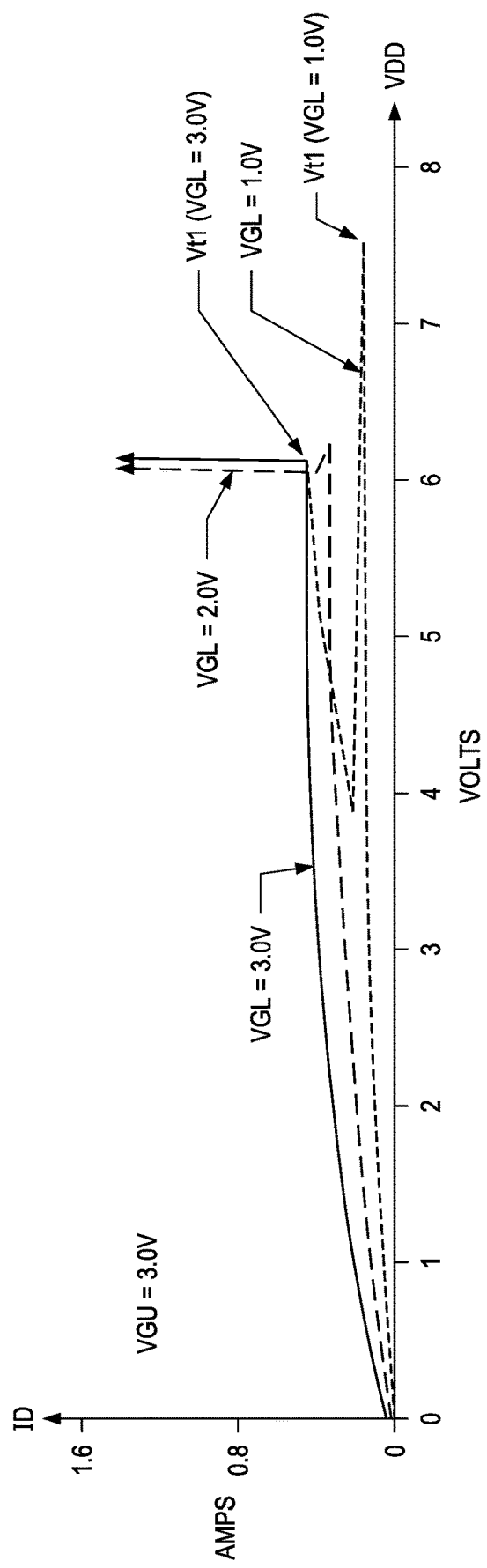

Clamp 300 was subjected to TLP testing with VGL at 1.0V, 2.0V, and 3.0V while VGU was held constant at 1.0V. TLP diagrams of this testing are shown in FIG. 4a. VGU was increased to 2.0V, and clamp 300 was subjected to TLP with VGL at 0.75V, 2.0V, and 3.0V. TLP diagrams of the second testing are shown in FIG. 4b. Lastly VGU was further increased to 3.0V, and clamp 300 was subjected to TLP with VGL at 1.0V, 2.0V, and 3.0V. TLP diagrams of the third testing are shown in FIG. 4c. Although not shown in FIGS. 4a-4c, when VGL increases above 3.0V the TLP diagrams are substantially the same as with VGL at 3.0V.

The TLP diagrams of FIGS. 4a-4c show the advantages of a higher VGL. More particularly the TLP diagrams show that VGL should be sufficiently high to turn on lower NMOS transistor 304 in active channel mode in order to pull down middle node 310 to VSS, which in turn lowers trigger voltage Vt1. In FIG. 4b, for example, Vt1 decreases almost 2 volts when VGL increases from 0.75V to 3.0V. With VGL at 2.0V or higher clamp 300 will enter bipolar snapback mode at a lower Vt1. Although not clearly shown in FIGS. 4a-4c, Vhold increases with VGU. Ideally VGU should be in a range (e.g., 1V-2V) to limit Vhold, which in turn minimizes the ESD stress voltage on the protected IC while ESD current is being discharged. Although not shown in FIGS. 4a-4c, It2 is relatively high with the various biasing of VGL and VGU, and as a result clamp 300 can be used as an effective ESD protection solution for an IC. It should be noted, however, It2 will decrease as VGU increases beyond 3.0V. But with VGU at 3.0V or less, clamp failure due to a reduced It2 should not be a problem.

The ability of stacked clamp 300 to discharge ESD current can be optimized if the trigger circuit increases VGL to a sufficiently high voltage level to activate the MOS channel of lower NMOS transistor 304, which in turn pulls down middle node 310 to VSS. The gate-to-source voltage on the upper NMOS transistor 302 should be at a voltage level sufficiently above the threshold voltage (Vth) of NMOS transistor 302, e.g. between 1V-2V. These conditions have been proven to ensure a reliable and fast transition of parasitic BJT 320 into snapback mode. These conditions also maximize the failure current (It2) of clamp 300.

The present disclosure is directed to a trigger circuit for optimizing stacked clamps like clamp 300. More particularly, the present disclosure is directed to a trigger circuit that controls one or more lower NMOS transistors and one or more upper NMOS transistors of a stacked clamp during an ESD event. In one embodiment, the trigger circuit controls the one or more lower NMOS transistors with an increasing VGL that lowers Vt1 to a value that safely protects ICs from damage during an ESD event. The trigger circuit also limits VGL so that the stacked clamp will have a relatively high failure current It2. The VGL can be limited to a certain value (e.g. 2V-3V) during the ESD event. The trigger circuit also controls the one or more upper NMOS transistors of the stacked clamp with a VGU that is sufficiently above the transistor threshold voltage Vt so that the one or more upper NMOS transistors are weakly activated during the ESD event. For powered ESD protection, the trigger circuit should control stacked clamp 300 to avoid a collapsing clamping voltage, i.e. the clamp must act in a regulation mode rather than a binary "on/off" mode (a.k.a. "latching" triggering scheme), and the trigger circuit should provide control voltages in proportion to the level of the ESD event. In one embodiment, the trigger circuit employs a feedback mechanism to boost VGL during an ESD event. This aspect helps ensure a more reliable stacked clamp transition to snapback mode, especially for those stacked clamps that contain multiple stacks of NMOS transistors.

Figure 5:
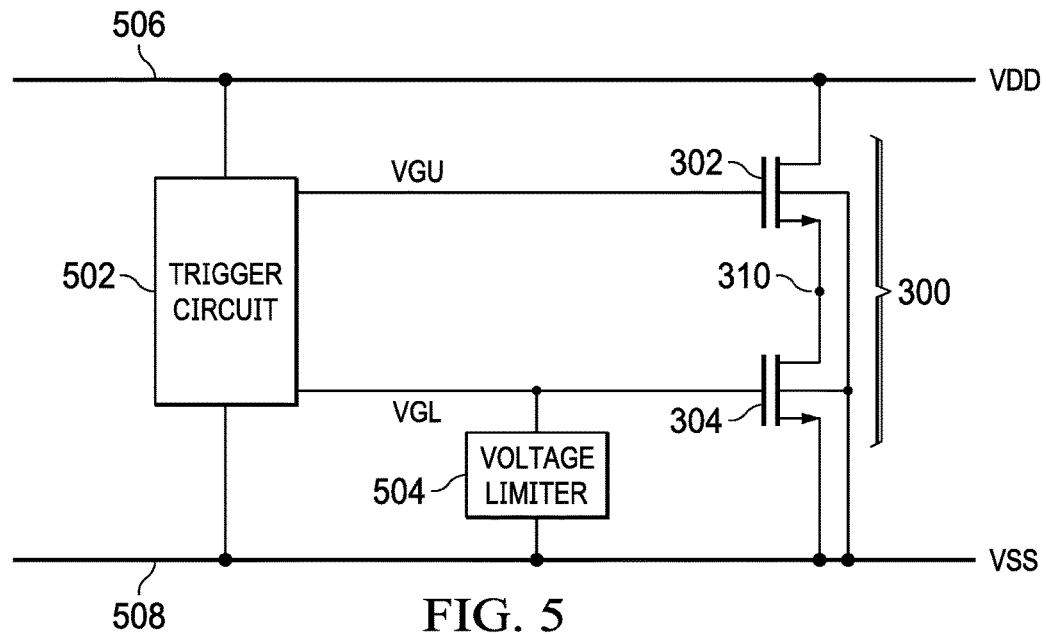
FIG. 5 is a schematic diagram of a circuit for controlling a stacked clamp according to one embodiment of the present disclosure.

FIG. 5 illustrates a trigger circuit 502 and a gate voltage limiter circuit 504 that can optimize stacked clamp 300 in accordance with one embodiment of the present disclosure. Trigger circuit 502 is coupled between supply and ground rails 506 and 508, respectively. Trigger circuit 502 controls NMOS transistors 302 and 304 with VGU and VGL, respectively. Although trigger circuit 502 and voltage limiter 504 control a clamp with a single stack of NMOS transistors in FIG. 5, the same trigger circuit and voltage limiter can control a clamp with multiple stacks of NMOS transistors.

During normal operation, trigger circuit 502 biases the gate of NMOS transistor 302 with VGU=VDD/2, and the gate of NMOS transistor 304 with VGL=VSS. In response to a sudden increase in VDD due to an ESD event, trigger circuit 502 increases VGL to place NMOS transistor 304 in active channel mode, which in turn pulls down node 310 towards VSS. VGL will continue to increase through a feedback mechanism more fully described below. Gate voltage limiter circuit 504 limits VGL to a predetermined value (e.g., 2V).

Figure 6:
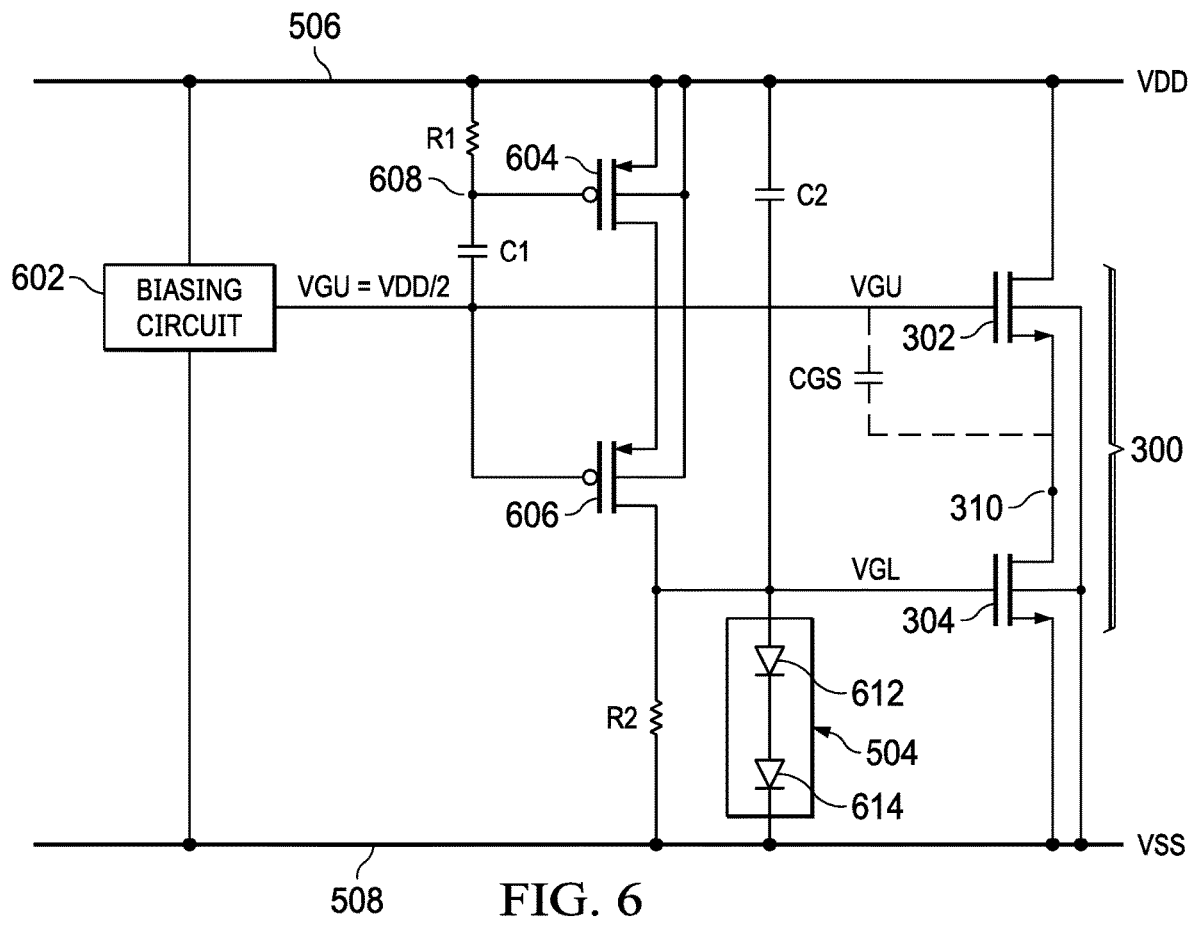
FIG. 6 illustrates one embodiment of the circuit shown in FIG. 5.

FIG. 6 illustrates an example embodiment of the trigger circuit 502 and voltage limiter circuit 504. In FIG. 6, the trigger circuit 502 includes a high impedance biasing circuit 602 coupled between supply and ground rails 506 and 508, respectively, as shown. In one embodiment biasing circuit 602 takes form in a voltage divider circuit that biases the gate of NMOS transistor 302 with VGU=VDD/2 during normal operation. Trigger circuit 502 also includes an RC filter consisting of resistor R1 and capacitor C1 coupled as shown between supply rail 506 and the output of high impedance biasing circuit 602.

The trigger circuit of FIG. 6 includes stacked PMOS transistors 604 and 606, which control current flow through resistor R2, and thus VGL. In an alternative embodiment, PMOS transistor 606 is removed such that there is a direct connection between the drain of PMOS transistor 604 and resistor R2. The embodiment shown in FIG. 6, however, may be advantageous due to the distribution of VDD across the stack of PMOS transistors 604 and 606, which in turn should reduce GIDL in these transistors.

Stacked PMOS transistors 604 and 606 are controlled by the voltage at internal node 608 and VGU, respectively. During normal operation, the gate of PMOS transistor 604 is biased to VDD via resistor R1. With zero voltage between the gate and source, PMOS transistor 604 is inactive or turned off, and no current flows through resistor R2, which may take form in a un-silicided poly resistor. As a result the gate of lower NMOS transistor 304 is biased to VGL=VSS through R2. With zero voltage between the gate and source, NMOS transistor 304, is inactive and conducts no current.

During an ESD event, VDD on the supply rail 506 suddenly increases. The voltage at the gate of PMOS transistor 604 will rise with VDD. However the R1C1 filter introduces a delay, and as result the rise of voltage at the gate of PMOS transistor 604 will lag the rise of VDD. PMOS transistor 604 will activate during the lag. Parasitic capacitance at the gate of NMOS transistor 302, also delays the rise of the VGU, initially biased at VDD/2 by the high impedance biasing circuit 602. More particularly, NMOS transistor 302 includes a parasitic capacitor CGS between its gate and source as shown, which delays the rise of VGU as VDD rises. PMOS transistor 606 activates as VGU lags VDD. Accordingly both PMOS transistors 604 and 606 will quickly activate with the ESD event. Activated PMOS transistors 604 and 606 transmit current between rails 506 and 508 via resistor R2. Voltage at the gate of NMOS transistor 304 will increase with increasing current flow through resistor R2. The increasing voltage VGL at the gate will activate the channel in NMOS transistor 304, which pulls down mid node 310 towards VSS. And with the gate of upper NMOS transistor 302 biased above its threshold voltage, the preferred gate bias conditions mentioned above are achieved. Lateral BJT of clamp 300 will activate, and clamp 300 enters the snapback mode with a relatively low Vt1. Once activated clamp 300 conducts ESD current to ground rail 508.

The trigger circuit uses an intrinsic feedback mechanism to increase its sensitivity to ESD events, which makes clamp 300 operate reliably, even with a low margin between a normal operating VDD and Vhold. More particularly, as the voltage continues to drop at mid node 310 with increasing VGL and thus increasing channel conduction of NMOS transistor 304, the voltage drop is fed back through CGS and C1, which in turn further reduces the voltages at the gates of PMOS transistors 606 and 604, respectively. The further drop in gate voltages in turn increases PMOS channel conduction, and thus current flow through resistor R2. The increase in current further raises the voltage across resistor R2, and thus the voltage VGL at the gate of NMOS transistor 304. This facilitates a smooth transition of clamp 300 into bipolar snapback mode.

Optional voltage limiter 504, which consists of diodes 612 and 614 in the embodiment of FIG. 6, limits VGL. The biasing scheme applied to the upper NMOS transistor 302 by trigger circuit 502 also limits the VGU to a level below VDD/2. By limiting both VGL and VGU, It2 is maintained at a relatively high level to prevent failure of clamp 300. Ultimately, clamp 300 is activated into snapback mode with a low Vt1 and a high It2. The triggering scheme works in similar fashion during an unpowered ESD event. To ensure sufficient voltage is applied to the gate of NMOS transistor 304 during a fast, unpowered ESD event (e.g., a Charged Device Model (CDM) event), an additional pull-up capacitor C2 is provided and coupled between VDD and the gate of NMOS transistor 304 in case the trigger circuit cannot react fast enough to the rising voltage on the supply rail 506.

Figure 7:
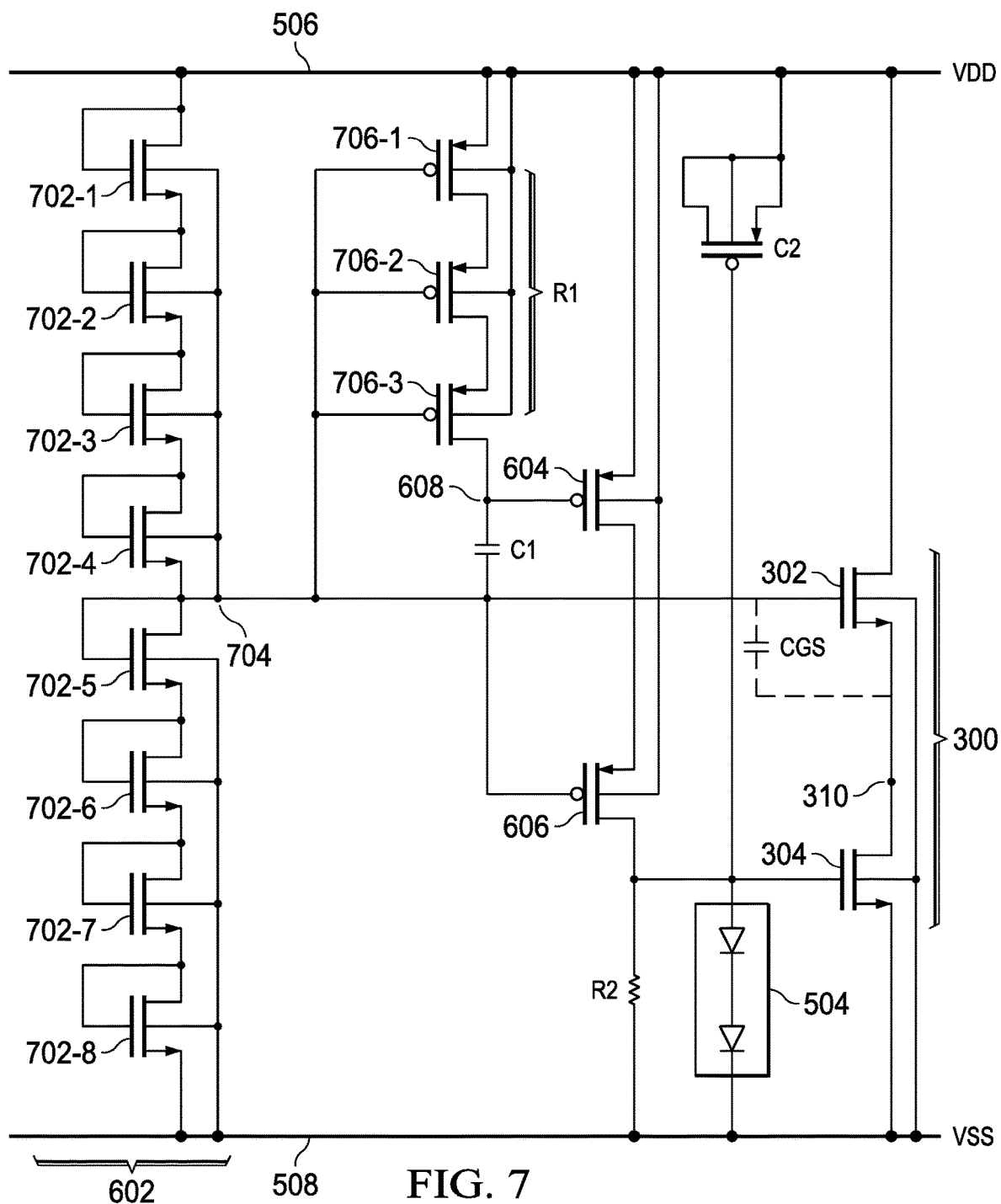
FIG. 7 illustrates one embodiment of the circuit shown within FIG. 6.

FIG. 7 illustrates example embodiments of the biasing circuit 602, the RC filter (i.e., R1 and C1), and capacitor C2 shown in FIG. 6. More particularly, the biasing circuit 602 includes a stack of eight long-channel/narrow-width NMOS transistors 702, tapped at mid node 704 of the stack, and forming a voltage divider. R1 takes form in a chain of three long-channel/narrow-width PMOS transistors 706 with their gates controlled by VGU. C1 is illustrated in schematic form for ease of illustration. C1 can take form in a PMOS transistor that is coupled as a capacitor similar to C2 as shown.

Figure 8A:
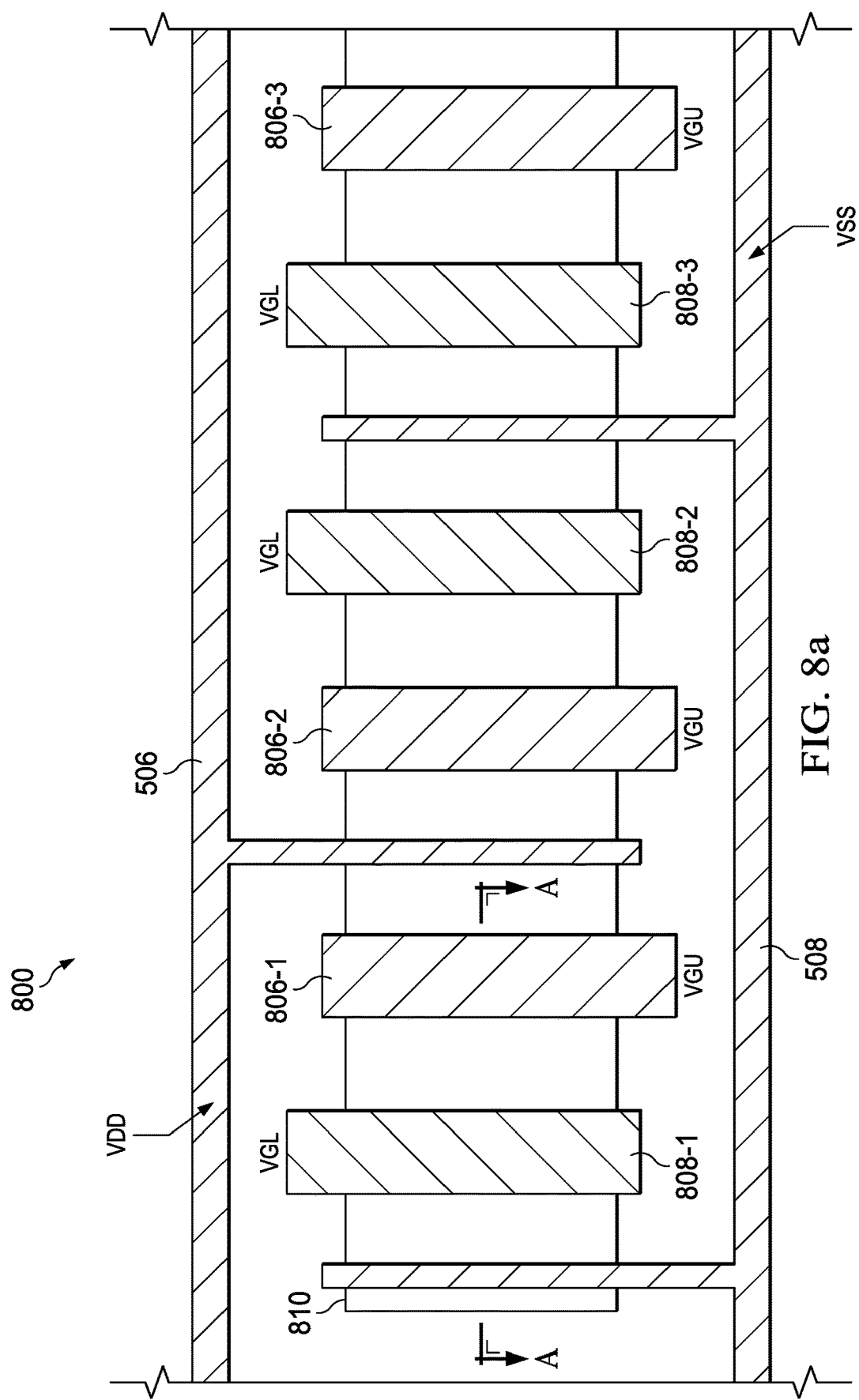
FIGS. 8a-8c illustrate layout, schematic, and a partial cross-sectional views of an alternative stacked clamp that can be controlled by the circuits shown within FIGS. 5-7.
Figure 8B:
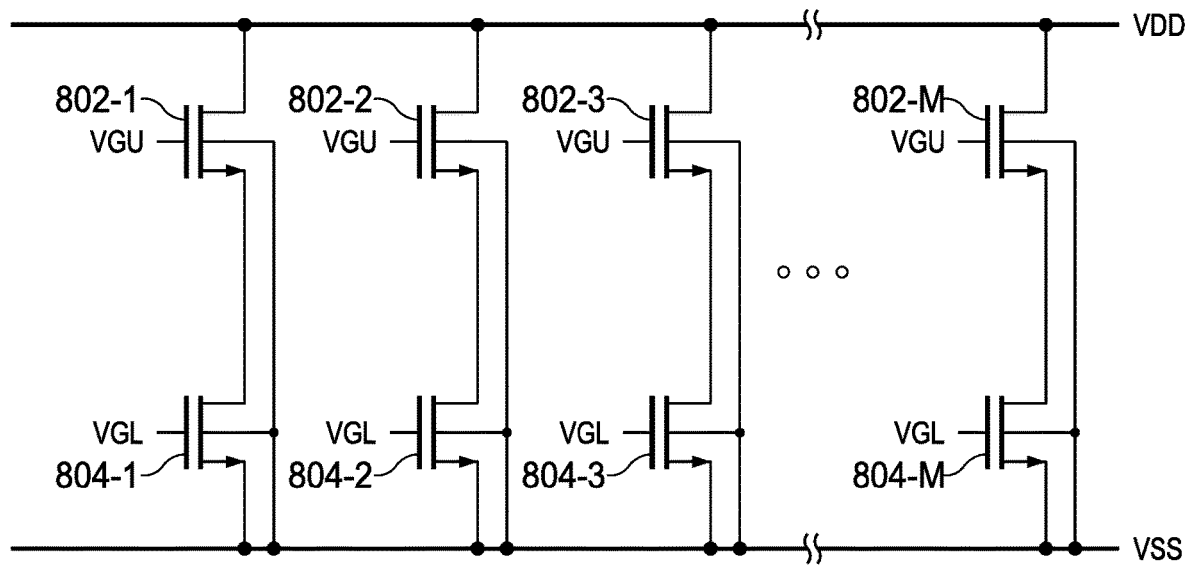
Figure 8C:
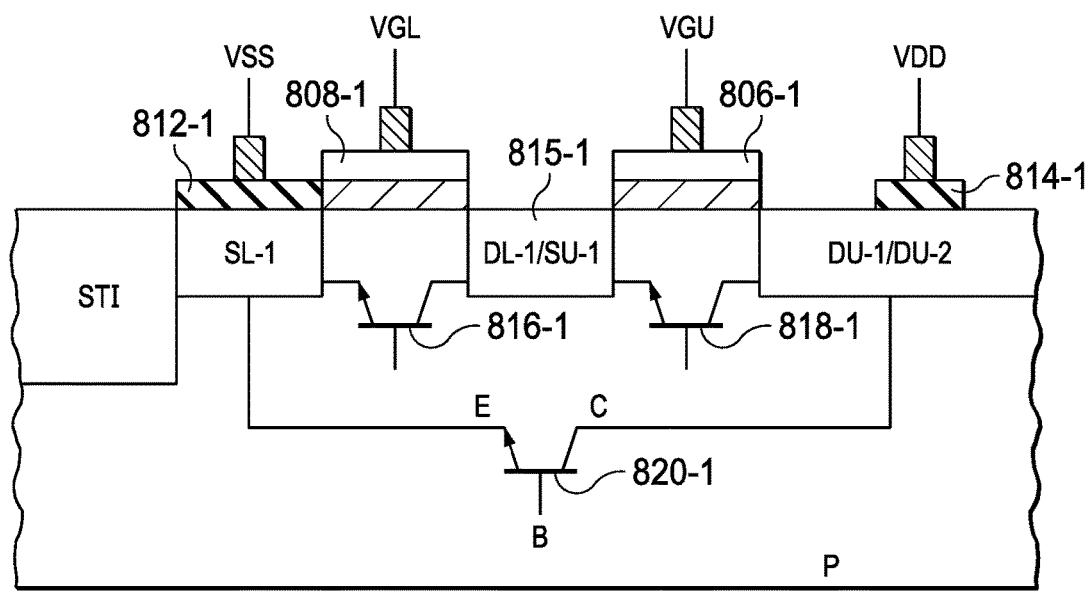

Stacked clamp 300 employs a single stack of NMOS transistors 302 and 304. Stacked clamps can employ multiple stacks of transistors coupled in parallel as noted above. FIGS. 8a-8c illustrate aspects of an example clamp 800 that contains M stacks of NMOS transistors, which are coupled in parallel between VDD and VSS, and which share an active silicon region. This configuration is often referred to as a "multi-fingered."

FIG. 8a illustrates a layout of stacked clamp 800 on a semiconductor substrate. FIG. 8b illustrates the schematic equivalent of clamp 800 shown in FIG. 8a. With reference to both FIGS. 8a and 8b, the upper and lower NMOS transistors 802-x and 804-x, respectively, of each stack include polysilicon gates 806-x and 808-x, respectively, extending over an active silicon area 810. NMOS transistors 802-x and 804-x of each stack share an active silicon region, which enables a lateral, parasitic BJT between the drain of the upper NMOS transistor 802-x and the source of the lower NMOS transistor 804-x as will be more fully described below. Conductive wires and contacts provide VDD and VSS to the drain and source of each stack of NMOS transistors 802-x and 804-x, respectively.

FIG. 8c illustrates a cross-sectional view of outer NMOS transistors 802-1 and 804-1 taken along line A-A of FIG. 8a (the conductive wires for VDD and VSS are not shown.) Lower polysilicon gate 808-1 and upper polysilicon gate 806-1 are connected to receive gate control voltages VGL and VGU, respectively. Lower source SL-1 is coupled to VSS via silicide layer 812-1. Upper drain DU-1 is partially covered by a silicide and coupled to VDD as shown. Active region 815-1 is shared by the NMOS transistors 802-1 and 804-1. More particularly, the shared active region contains the lower drain DL-1 of NMOS transistor 804-1 and the upper source SU-1 of NMOS transistor 802-1. FIG. 8c also shows parasitic BJTs 816-1 and 818-1. Because lower drain DL-1 and upper source SU-1 share active region 815-1, the combination of BJTs 816-1 and 818-1 acts as a lateral parasitic BJT 820-1.

The trigger circuit shown in FIGS. 6 and 7 reliably activates clamp 800 during an ESD event. The substrate resistance in the inner fingers of clamp 800 is greater than the substrate resistance in the outer fingers, such as the outer finger shown in FIG. 8c. As a result the base-emitter junctions of the lateral BJTs of the inner fingers will be forward biased before the base-emitter junctions of the lateral BJTs of the outer fingers. In other words the inner finger clamps will transition to snapback mode, before the outer finger clamps. The trigger circuit uses the intrinsic feedback mechanism described above to boost VGL during an ESD event, which in turn ensures reliable snapback transition of outer fingers of clamp 800. As a result, all fingers of clamp 800 will more reliably transition to snapback during the ESD event.

The following are various embodiments of the present disclosure. An integrated is circuit formed on a substrate, and the integrated circuit includes first and second conductors for providing supply and ground voltages, respectively, and a clamp device including first and second metal oxide semiconductor (MOS) transistors coupled in series between the first and second conductors. The first and second MOS transistors include first and second gates, respectively. In addition the integrated circuit also includes a trigger circuit coupled between the first and second conductors and configured to drive the first and second gates with first and second voltages, respectively. The trigger circuit includes a biasing circuit for generating the first voltage as a function of the supply voltage, a third MOS transistor coupled between the first conductor and the second gate, the third MOS transistors including a third gate. The trigger circuit also includes a resistive element coupled between the first conductor and the third gate, and a capacitive element coupled between the third gate and the first gate. The third MOS transistor is configured to increase the second voltage in response to an increase in the supply voltage. In one aspect, the trigger circuit further includes a voltage limiter circuit coupled to the second conductor and configured to limit the second voltage. The voltage limiter circuit is configured to limit the second voltage to a magnitude that is less than a magnitude of voltage on the first conductor while the supply voltage is increasing. The voltage limiter circuit may include a diode coupled between the second gate and the second conductor, wherein the diode includes an anode coupled to the second gate. In another aspect, the first and second MOS transistors include first and second NMOS transistors, respectively. A source of the first NMOS transistor and a drain of the second NMOS transistor may share a common active area of the substrate. In another aspect the trigger circuit further includes a fourth MOS transistor coupled between the third MOS transistor and the second gate, wherein the fourth MOS transistor includes a fourth gate coupled to the first gate and to the capacitive element. The third and fourth MOS transistors may take form in third and fourth PMOS transistors, respectively. In yet another aspect, a fourth MOS transistor is coupled between the third MOS transistor and another resistive element. In one more aspect, the biasing circuit includes a voltage divider, wherein the first voltage generated by the voltage divider is less than supply voltage on the first conductor.

In another embodiment, an integrated circuit is formed on a substrate, and the integrated circuit includes first and second conductors for providing supply and ground voltages, respectively, a first clamp, and a second clamp. The first clamp device includes first upper and lower metal oxide semiconductor (MOS) transistors coupled in series between the first and second conductors, wherein the first upper and lower MOS transistors include first upper and lower gates, respectively. The trigger circuit is coupled between the first and second conductors and configured to drive the first upper and lower gates with first and second voltages. The trigger circuit includes a biasing circuit for generating the first voltage as a function of the supply voltage, a first PMOS transistor including a first gate, a first source, and a first drain. The trigger circuit also includes a first resistive element coupled between the first conductor and the first gate, and a capacitive element coupled between the first gate and the first upper gate. The first PMOS transistor can be activated in response to an increase in the supply voltage, and the second voltage can be generated in response to activation of the first PMOS transistor. In one aspect, a second resistive element is included that has first and second terminals, wherein the first terminal is coupled to the first lower gate and the first source, and wherein the second terminal is coupled to the second conductor. In another aspect, the clamp device further includes second upper and lower MOS transistors coupled in series between the first and second conductors, wherein the second upper and lower MOS transistors include second upper and lower gates, respectively. The second upper and lower gates are configured to receive the first and second voltages, respectively. The first and second upper MOS transistors can be positioned adjacent to each other in the substrate, and the first and second upper MOS transistors can be positioned between the first and second lower MOS transistors in the substrate. In yet another aspect, the trigger circuit further includes a voltage limiter circuit configured to limit the second voltage to a predetermined magnitude. The voltage limiter circuit may include first and second diodes coupled in series between the first lower gate and the second conductor, wherein the first diode includes an anode coupled to the first lower gate. In a further aspect, the first upper and lower MOS transistors take for in first upper and lower NMOS transistors, respectively. A source of the first upper NMOS transistor and a drain of the first lower NMOS transistor can share a common active area of the substrate.

In yet another embodiment, an integrated circuit is formed on a substrate, and the integrated circuit includes first and second conductors for providing supply and ground voltages, respectively, a clamp device, and a trigger circuit. The clamp device includes first and second metal oxide semiconductor (MOS) transistors coupled in series between the first and second conductors, wherein the first and second MOS transistors include first and second gates, respectively. The trigger circuit is coupled between the first and second conductors and is configured to drive the first and second gates with first and second voltages, respectively, in response to an electrostatic discharge (ESD) event. The trigger circuit includes a biasing circuit for generating the first voltage as a function of the supply voltage, a PMOS transistor coupled between the first conductor and the second gate, the PMOS transistors includes a third gate. The trigger circuit also includes a resistive element coupled between the first conductor and the third gate, and a capacitive element coupled between the third gate and the first gate. A voltage at the third gate should decrease in response to activation of the second MOS transistor. In one aspect, the trigger circuit is configured to drive the second gate with the ground voltage prior to the ESD event.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An integrated circuit formed on a substrate, the integrated circuit comprising:
   first and second conductors for providing supply and ground voltages, respectively;
   a clamp device comprising first and second metal oxide semiconductor (MOS) transistors coupled in series between the first and second conductors, wherein the first and second MOS transistors comprise first and second gates, respectively;
   a trigger circuit coupled between the first and second conductors and configured to drive the first and second gates with first and second voltages, respectively, the trigger circuit comprising:
   a biasing circuit for generating the first voltage as a function of the supply voltage;
   a third MOS transistor coupled between the first conductor and the second gate, wherein neither a source nor a drain of the third MOS transistor is connected to the first gate, the third MOS transistor comprising a third gate;
   a resistive element having a first terminal directly connected to the first conductor and a second terminal directly connected to the third gate;
   a capacitive element having a first terminal directly connected to the third gate and a second terminal coupled to the first gate;
   wherein the third MOS transistor is configured to increase the second voltage in response to an increase in the supply voltage.

2. The integrated circuit of claim 1 wherein the trigger circuit further comprises a voltage limiter circuit coupled to the second conductor and configured to limit the second voltage.

3. The integrated circuit of claim 2 wherein the voltage limiter circuit is configured to limit the second voltage to a magnitude that is less than a magnitude of voltage on the first conductor while the supply voltage is increasing.

4. The integrated circuit of claim 3 wherein voltage limiter circuit comprises a diode coupled between the second gate and the second conductor, wherein the diode comprises an anode coupled to the second gate.

5. The integrated circuit of claim 1 wherein the first and second MOS transistors comprise first and second NMOS transistors, respectively.

6. The integrated circuit of claim 5 wherein a source of the first NMOS transistor and a drain of the second NMOS transistor share a common active area of the substrate.

7. The integrated circuit of claim 1 wherein the trigger circuit further comprises a fourth MOS transistor coupled between the third MOS transistor and the second gate, wherein the fourth MOS transistor comprises a fourth gate directly connected to the first gate and to the capacitive element.

8. The integrated circuit of claim 7 wherein the third and fourth MOS transistors comprise third and fourth PMOS transistors.

9. The integrated circuit of claim 1 wherein a fourth MOS transistor is coupled between the third MOS transistor and another resistive element, wherein the third MOS transistor, fourth MOS transistor, and the another resistive element are coupled in series between the first and second conductors.

10. The integrated circuit of claim 1 wherein the biasing circuit comprises a voltage divider, wherein the first voltage generated by the voltage divider is less than supply voltage on the first conductor.

11. The integrated circuit of claim 1 wherein the trigger circuit further comprises a voltage limiter circuit coupled between the second gate and the second conductor and a second resistive element coupled in parallel with the voltage limiter circuit between the second gate and the second conductor.

12. An integrated circuit formed on a substrate, the integrated circuit comprising:
   first and second conductors for providing supply and ground voltages, respectively;

a first clamp device comprising first upper and lower metal oxide semiconductor (MOS) transistors coupled in series between the first and second conductors, wherein the first upper and lower MOS transistors comprise first upper and lower gates, respectively;

a trigger circuit coupled between the first and second conductors and configured to drive the first upper and lower gates with first and second voltages, respectively, the trigger circuit comprising:

a biasing circuit for generating the first voltage as a function of the supply voltage;

a first PMOS transistor comprising a first gate, a first source, and a first drain, wherein the first source is connected to the first conductor and the first drain is coupled to the first lower gate but is not connected to the first upper gate;

a first resistive element having a first terminal directly connected to the first conductor and a second terminal directly connected to the first gate;

a capacitive element having a first terminal directly connected to the first gate and a second terminal coupled to the first upper gate;

wherein the first PMOS transistor is activated in response to an increase in the supply voltage;

wherein the second voltage is generated in response to activation of the first PMOS transistor.

13. The integrated circuit of claim 12 further comprising a second resistive element comprising first and second terminals, wherein the first terminal is coupled to the first lower gate and the first source, and wherein the second terminal is coupled to the second conductor.

14. The integrated circuit of claim 12 wherein the first clamp device further comprises:

second upper and lower MOS transistors coupled in series between the first and second conductors, wherein the second upper and lower MOS transistors comprise second upper and lower gates, respectively;

wherein the second upper and lower gates are configured to receive the first and second voltages, respectively.

15. The integrated circuit of claim 14 wherein the first and second upper MOS transistors positioned adjacent to each other in the substrate, and wherein the first and second upper MOS transistors positioned between the first and second lower MOS transistors in the substrate.

16. The integrated circuit of claim 12 wherein the trigger circuit further comprises a voltage limiter circuit configured to limit the second voltage to a predetermined magnitude.

17. The integrated circuit of claim 16 wherein voltage limiter circuit comprises first and second diodes coupled in series between the first lower gate and the second conductor, wherein the first diode comprises an anode coupled to the first lower gate.

18. The integrated circuit of claim 12 wherein the first upper and lower MOS transistors comprise first upper and lower NMOS transistors, respectively.

19. The integrated circuit of claim 18 wherein a source of the first upper NMOS transistor and a drain of the first lower NMOS transistor share a common active area of the substrate.

20. An integrated circuit formed on a substrate, the integrated circuit comprising:

first and second conductors for providing supply and ground voltages, respectively;

a clamp device comprising first and second metal oxide semiconductor (MOS) transistors coupled in series between the first and second conductors, wherein the first and second MOS transistors comprise first and second gates, respectively;

a trigger circuit coupled between the first and second conductors and configured to drive the first and second gates with first and second voltages, respectively, in response to an electrostatic discharge (ESD) event, the trigger circuit comprising:

a biasing circuit including a voltage divider for generating the first voltage at an output of the voltage divider as a function of the supply voltage, wherein the output of the voltage divider is directly connected to the first gate so as to provide the first voltage directly to the first gate;

a PMOS transistor coupled between the first conductor and the second gate, the PMOS transistor comprising a third gate;

a resistive element having a first terminal directly connected to the first conductor and a second terminal directly connected to the third gate;

a capacitive element having a first terminal directly connected to the third gate and a second terminal coupled to the first gate;

wherein a voltage at the third gate decreases in response to activation of the second MOS transistor.

21. The integrated circuit of claim 20 wherein the trigger circuit is configured to drive the second gate with the ground voltage prior to the ESD event.

* * * * *